United States Patent
Shimao

(10) Patent No.: US 8,390,176 B2
(45) Date of Patent: Mar. 5, 2013

(54) STACKED CRYSTAL RESONATOR AND MANUFACTURING METHOD THEREOF

(75) Inventor: Kenji Shimao, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 335 days.

(21) Appl. No.: 12/806,968

(22) Filed: Aug. 25, 2010

(65) Prior Publication Data

US 2011/0049093 A1 Mar. 3, 2011

(30) Foreign Application Priority Data

Aug. 27, 2009 (JP) .................................. 2009-197113
Mar. 30, 2010 (JP) .................................. 2010-077207

(51) Int. Cl.
*H01L 41/00* (2006.01)
*H02N 2/00* (2006.01)
(52) U.S. Cl. ........................ 310/344; 310/367; 310/370
(58) Field of Classification Search ........................ None
See application file for complete search history.

(56) References Cited

U.S. PATENT DOCUMENTS

| 6,496,085 B2 * | 12/2002 | Ella et al. ...................... 333/189 |
| 8,159,115 B2 * | 4/2012 | Mizusawa ...................... 310/344 |
| 2001/0049093 A1 * | 12/2001 | Sugden et al. ...................... 435/5 |
| 2006/0255691 A1 * | 11/2006 | Kuroda et al. ................ 310/348 |

FOREIGN PATENT DOCUMENTS

| JP | 55-013553 | 1/1980 |
| JP | 55-166321 | 12/1980 |
| JP | 58-157211 | 9/1983 |
| JP | 2007-142526 | 6/2007 |
| JP | 2008-148351 | 6/2008 |
| JP | 2009-060479 | 3/2009 |

\* cited by examiner

*Primary Examiner* — Duy Deo
(74) *Attorney, Agent, or Firm* — Edwards Wildman Palmer LLP; Scott D. Wofsy

(57) ABSTRACT

An object of the invention is to provide a method of manufacturing a stacked crystal resonator whereby a large number of stacked crystal resonators formed on a wafer can be easily broken away from the wafer, and the risk of damage to the outside surfaces and the like of the stacked crystal resonators is reduced. There is formed a framed crystal plate connected to a first wafer by a first support section, a cover connected to a second wafer by a second support section, and a base connected to a third wafer by a third support section, and a thickness of at least one of the first support section through third support section is thinner than a thickness the connected wafer.

9 Claims, 15 Drawing Sheets

STACKED CRYSTAL RESONATOR AND MANUFACTURING METHOD THEREOF

BACKGROUND OF THE INVENTION

1. Technical Field

The present invention relates to a stacked crystal resonator, in particular to a method of manufacturing a crystal resonator of a stacked type in which a crystal plate with a resonating section formed thereon is stacked between a base and a cover.

2. Background Art

A stacked crystal resonator is widely employed particularly in portable electronic devices as a source of frequency reference or time reference because of its small size and light weight. Responding to the needs of the information-oriented society in recent years, consumption of stacked crystal resonators is high and consequently there is a demand for an improvement in the productivity thereof. An example thereof is a stacked crystal resonator in which a base and a cover are stacked on the two main surfaces of a framed crystal plate composed of a resonating section and a frame section that surrounds the resonating section.

3. Prior Art

FIG. 12 to FIG. 15 are drawings describing a conventional example of a stacked crystal resonator, wherein FIG. 12 is an exploded view thereof, FIG. 13A is a plan view of a wafer on which a large number of covers are formed, FIG. 13B is a plan view of a wafer on which a large number of framed crystal plates are formed, FIG. 13C is a plan view of a wafer on which a large number of bases are formed, FIG. 14 is an exploded view illustrating the superposition of the wafers, and FIG. 15 is a cross-sectional view (along the line XV-XV in FIG. 14) illustrating the superposition of the wafers.

The stacked crystal resonator 1 disclosed in Patent Document 1, as shown in FIG. 12, comprises a framed crystal plate 7 in which a resonating section 4 with a tuning fork-shaped planar outer dimension having two vibrating arms 3 extending from one side face of a base section 2 is surrounded by a frame 5, and the resonating section 4 and the frame 5 are joined by connecting sections 6, and further comprises a cover 8 and a base 9 which are bonded to the two main surfaces of the framed crystal plate 7 so as to seal-enclose the resonating section 4.

Exciting electrodes 10 are formed on the two main surfaces and two side surfaces of the vibrating arms 3 of the framed crystal plate 7 shown in FIG. 12. Furthermore, extraction electrodes 11 extend from the exciting electrodes 10 to the base section 2 of the resonating section 4. On the side surfaces of the base section 2 where the vibrating arms 3 are not formed, connecting sections 6 extend from the two side surfaces on mutually opposite sides, to the frame section 5, and the extraction electrodes 11 extend to the two main surfaces of the frame section 5 via the two main surfaces of the connecting sections 6.

Furthermore, the cover 8 shown in FIG. 12 is composed of crystal or glass, and a concave section 12a is formed in a region of the main surface opposing the resonating section 4.

Moreover, the base 9 is also composed of crystal or glass, and comprises a concave section 12b formed in a region of the main surface opposing the resonating section 4. Furthermore, auxiliary electrodes 13 are formed in parts of the base 9 which oppose the extraction electrodes 11, and the extraction electrodes 11 and the auxiliary electrodes 13 connect electrically by mutual contact. Moreover, the auxiliary electrodes 13, via a conducting path (not shown) on the inside surface of through holes 14 formed at the approximate center of the auxiliary electrodes 13, are electrically connected to mount terminals (not shown) formed on the opposite surface from the main surface opposing the framed crystal plate 7. The through holes 14 are filled with, for example, a gold-tin (Au—Sn) alloy.

In such a stacked crystal resonator, first, etching is conducted on a crystal wafer 15a shown in FIG. 13B to form a plurality of the framed crystal plates 7 and support sections 16a which connect the framed crystal plates 7 to the crystal wafer 15a. Furthermore, etching is conducted on the crystal wafer 15b shown in FIG. 13A to form the covers 8 and support sections 16b which connect the covers 8 to the crystal wafer 15b. At this time, half-etching is conducted on the covers 8 to form the concave section 12a shown in FIG. 13A. Moreover, etching is conducted on the crystal wafer 15c shown in FIG. 13C to form the bases 9 and support sections 16c which connect the bases 9 to the crystal wafer 15c. At this time, the through holes 14 and the concave sections 12b are formed in the bases 9. The concave sections 12a and 12b are formed in the wafers 15b and 15c by half-etching.

Next, by vapor deposition or sputtering, the exciting electrodes 10 and the extraction electrodes 11 are formed on the framed crystal plate 7 shown in FIG. 14, and the auxiliary electrodes 13, the mount terminals, and the conducting path inside the through holes 14 are formed in the base 9. Then, the crystal wafer 15a and the crystal wafer 15c are superposed onto the two main surfaces of the crystal wafer 15b. Subsequently, the two main surfaces of the frame 5 are joined to the base 9 and the cover 8 by siloxane bonding.

Next, the resonating section 4 is seal-enclosed by filling the through holes 14 with, for example, a gold-tin (Au—Sn) alloy and then performing heating. By this process, the individual stacked crystal resonators 1 connected to the crystal wafers 15a, 15b, and 15c by the support sections 16a, 16b, and 16c are formed. Finally, by applying pressing force to the base 9 or cover 8 of the stacked crystal resonator 1, the stacked crystal resonator 1 is broken out of the crystal wafers 15a, 15b, and 15c. In other words, the stacked crystal resonators 1 are separated into individual pieces from the crystal wafers 15a, 15b, and 15c by breaking the support sections 16a, 16b, and 16c.

(Refer to Patent Document 1: Japanese Unexamined Patent Publication No. 2009-60479 (paragraph 0043; FIG. 4))

PROBLEMS IN PRIOR ART

However, in the stacked crystal resonator 1 of the conventional example with the above configuration, when the crystal wafers 15a, 15b, and 15c are superposed during the manufacturing process, as shown in FIG. 15, the total thickness of the support sections 16a, 16b, and 16c equals the thickness of the stacked crystal resonator 1. Therefore, a significant amount of force must be applied when pressing the stacked crystal resonator 1 connected to the crystal wafers 15a, 15b, and 15c to break out from the support sections 16a, 16b, and 16c into individual pieces, and damage can occur to the outside surfaces and the like of the stacked crystal resonators 1 where the support sections 16a, 16b, and 16c are formed.

An object of the present invention is to provide a method of manufacturing a stacked crystal resonator which can be easily broken away from the crystal wafer to give individual components, and which reduces the risk of damage to the outside surfaces and the like.

SUMMARY OF THE INVENTION

First Means for Solving the Problems

The present invention provides a method of manufacturing a stacked crystal resonator, comprising: the steps of etching a first wafer made of crystal to form, a framed crystal plate in which a resonating section is surrounded by a frame section and the resonating section is connected to the frame section by a connecting section, and a first support section which connects the framed crystal plate to the first wafer; etching a second wafer to form, a cover to be bonded in a later step to a main surface of the frame section, and a second support section which connects the cover to the second wafer; etching a third wafer to form, a base to be bonded in a later step to another main surface of the frame section, and a third support section which connects the base to the third wafer; superposing the second and third wafers onto the two main surfaces of the first wafer and bonding the cover and base to the two main surfaces of the frame section of the framed crystal plate so as to seal-enclose the resonating section, thereby forming a stacked crystal resonator connected to the first through third wafers by the first through third support sections; and breaking out the stacked crystal resonators connected to the first through third wafers into individual pieces; wherein a thickness of at least one of the first through third support sections is thinner than a thickness of a connection section connecting the framed crystal plate, the cover, or the base to the first through third support sections.

Second Means for Solving the Problems

The present invention also provides a method of manufacturing a stacked crystal resonator, comprising: the steps of etching a first wafer made of crystal to form, a framed crystal plate in which a resonating section is surrounded by a frame section and the resonating section is connected to the frame section by a connecting section, and a first support section which connects the framed crystal plate to the first wafer; etching a second wafer to form, a cover to be bonded in a later step to a main surface of the frame section, and a second support section which connects the cover to the second wafer; etching a third wafer to form, a base to be bonded in a later step to another main surface of the frame section, and a third support section which connects the base to the third wafer; superposing the second and third wafers on the two main surfaces of the first wafer and bonding the cover and base to the two main surfaces of the frame section of the framed crystal plate so as to seal-enclose the resonating section, thereby forming a stacked crystal resonator connected to the first through third wafers by the first through third support sections; and breaking out the individual stacked crystal resonators connected to the first through third wafers; wherein when the first through third wafers are superposed, the second support section and/or third support section are disposed in an oblique direction relative to the thickness direction of the first wafer in the first support section.

According to the manufacturing method of the first means for solving the problems, a construction is obtained in which the thickness of the first support section is thinner than the thickness of a connection section connecting the framed crystal plate to the first support section, and/or the thickness of the second support section is thinner than the thickness of a connection section connecting the cover to the second support section, and/or the thickness of the third support section is thinner than the thickness of a connection section connecting the base to the third support section. Therefore, the total thickness of the first through third support sections is smaller in comparison with a case where the first through third support sections are not subjected to etching. Accordingly, individual stacked crystal resonators can be broken out of the first through third wafers using less force than in a case where the first through third support sections are not subjected to etching. Therefore, the stacked crystal resonators can be easily broken out of the wafers, and when breaking out, the likelihood of damage occurring to the outside surfaces and the like where the support sections of the stacked crystal resonators are formed is reduced.

Aspects for the First Means for Solving the Problems

In the present invention, in the manufacturing method of a stacked crystal resonator according to the first means for solving the problems, in the step of etching the second wafer, etching is conducted on the opposite surface of the second support section to the surface facing the first wafer, so that the thickness of the second support section is thinner than the thickness of the connection section connecting the cover to the second support section, and in the step of etching the third wafer, etching is conducted on the opposite surface of the third support section to the surface facing the first wafer, so that the thickness of the third support section is thinner than the thickness of the connection section connecting the base to the third support section.

By this process, when the stacked crystal resonators connected to the first through third wafers are formed, stepped sections are formed by the sides of the two main surfaces of the stacked crystal resonator, and the second and third support sections sunken into these two main surfaces. Therefore, when breaking out the stacked crystal resonators, the stress is concentrated on the first through third support sections. Accordingly, the stacked crystal resonators can be broken away easily from the wafers into individual pieces, and when breaking out, the likelihood of damage occurring to the outside surfaces and the like where the support sections of the stacked crystal resonators are formed is reduced.

According to the manufacturing method of the first means for solving the problems, the first through third support sections to not overlap in their entirety. Therefore, the first through third support sections bend easily when breaking out the stacked crystal resonators from the wafers. Accordingly, compared to the case where the first through third support sections overlap in their entirety, the stacked crystal resonators can be broken away easily into individual pieces using a small amount of force, and the likelihood of damage occurring to the outside surfaces and the like where the first through third support sections of the stacked crystal resonators are formed is reduced.

Aspects for the Second Means for Solving the Problems

In a manufacturing method of a stacked crystal resonator of the present invention, when the first through third wafers are superposed, the first through third support sections are formed so as to be disposed upon a diagonal line on the same outside surface of the stacked crystal resonator. Thereby, the location of the first through third support sections is easily ascertained.

In a manufacturing method of a stacked crystal resonator of the present invention, when the first through third wafers are superposed, the first through third support sections are formed so as to be disposed at a different outside surface of the stacked crystal resonator.

By this process, the first through third support sections are not adjacent when the first through third wafers are superposed. Therefore, when breaking out the stacked crystal resonators into individual pieces, the stress is concentrated on one or other of the first through third support sections. For example, the stress is first concentrated on the first support section causing cracks therein, the stress is next concentrated on the second support section causing cracks therein, and the stress is finally concentrated on the third support section causing cracks therein, after which the first through third support sections break. Accordingly, in comparison with a case where the first through third support sections superpose in their entirety, individual stacked crystal resonators can be broken out easily using a small amount of force.

In the present invention, in a manufacturing method of a stacked crystal resonator, the thickness of at least one of the first through third support sections is thinner than the thickness of the connection section connecting the framed crystal plate, the cover, or the base to the first through third support sections.

Therefore, the total thickness of the first through third support sections is less than in a case where the first through third support sections are not subjected to etching. Accordingly, the individual stacked crystal resonators can be easily broken away using a smaller amount of force than if the first through third support sections were not subjected to etching.

BRIEF DESCRIPTION OF THE DRAWINGS

FIG. 2 includes partial plan views of wafers according to the first embodiment pictured from direction A shown in FIG. 1, wherein

FIG. 4 includes plan views of wafers for describing a first modified example of the first embodiment, wherein

FIG. 6 includes partial plan views of wafers for describing a second embodiment of the present invention, wherein

FIG. 13 includes plan views of wafers on which a plurality of conventional stacked crystal resonators are formed from direction B shown in FIG. 12, wherein

DETAILED DESCRIPTION OF THE PREFERRED EMBODIMENTS

Figure 1:
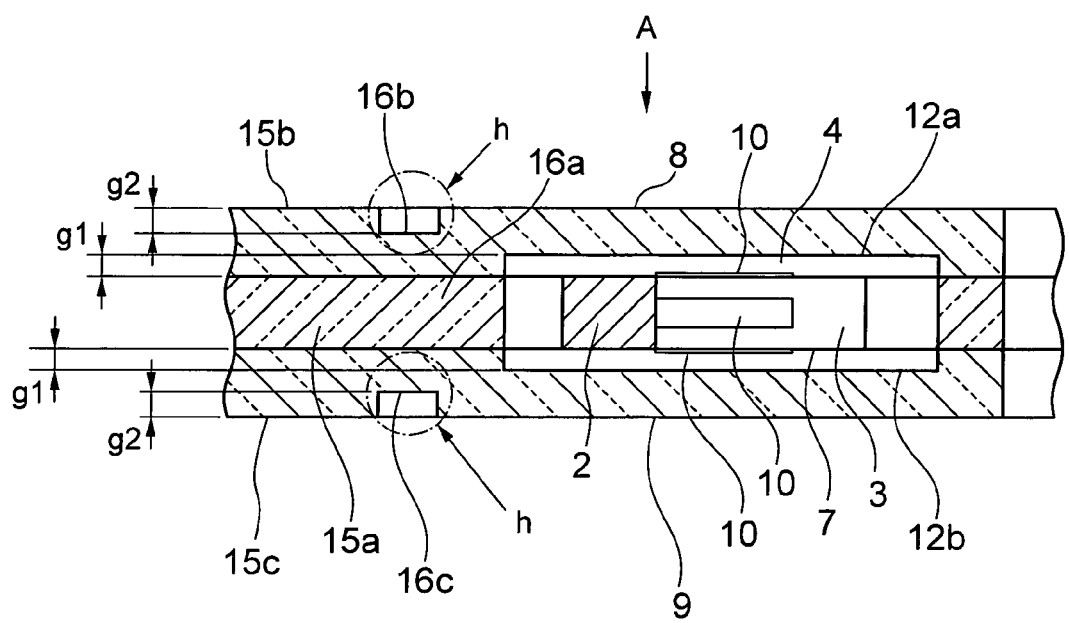
FIG. 1 is a cross-sectional view along the line I-I in FIG. 2, describing a first embodiment of a stacked crystal resonator of the present invention when the wafers are superposed.
Figure 12:
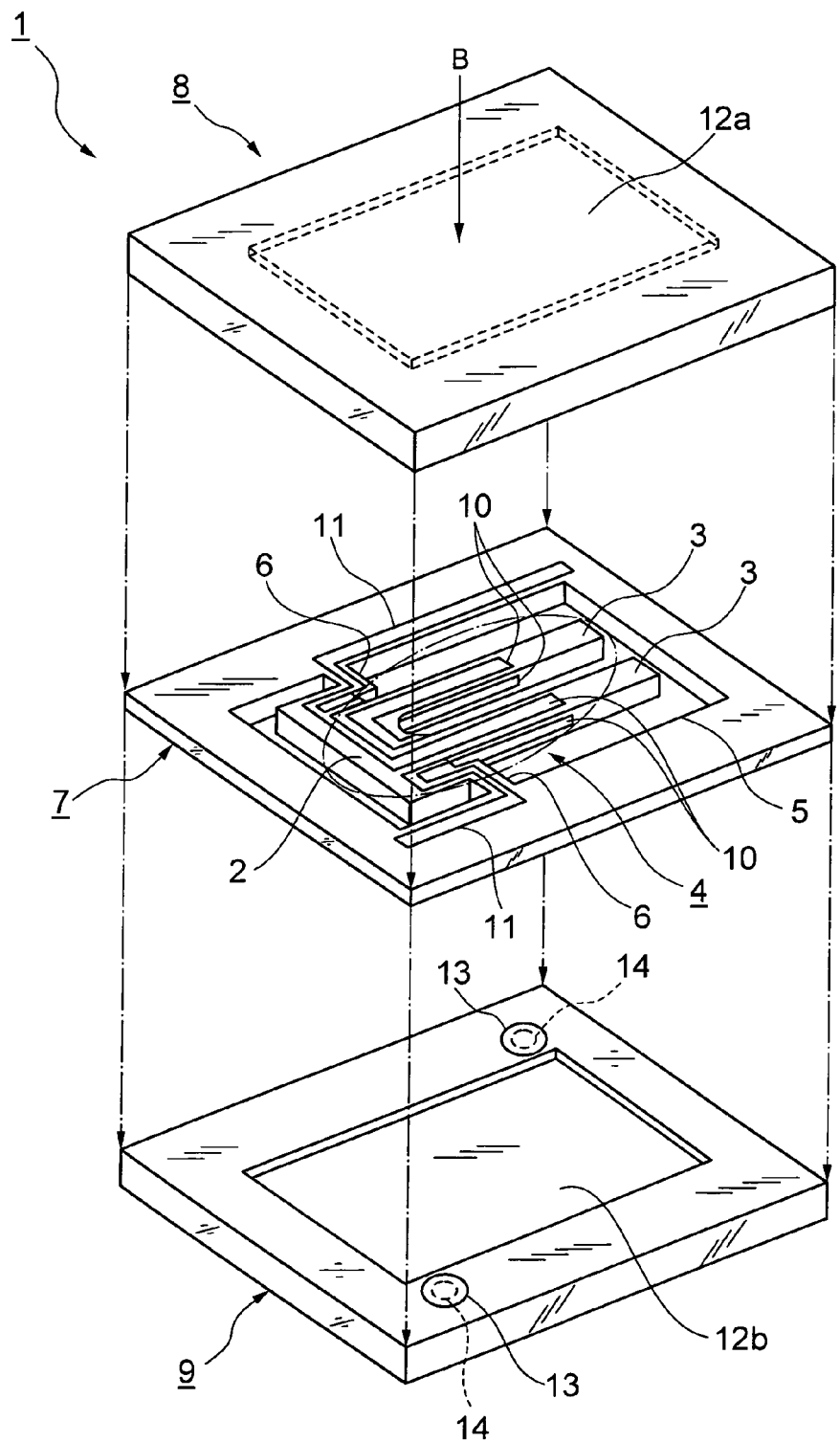
FIG. 12 is an exploded view for describing a conventional example of a stacked crystal resonator.

A stacked crystal resonator 1 of a first embodiment of the present invention, in the same manner as the stacked crystal resonator of the conventional example shown in FIG. 12, as shown in FIG. 1, comprises a framed crystal plate 7 in which a resonating section 4 with a tuning fork-shaped planar outer dimension in which two vibrating arms 3 extend from one side face of a base section 2 is surrounded by a frame 5, and the resonating section 4 and the frame 5 are joined by connecting sections 6, and a cover 8 and a base 9 which are bonded to the two main surfaces of the frame 5 so as to seal-enclose the resonating section 4.

Figure 2A:
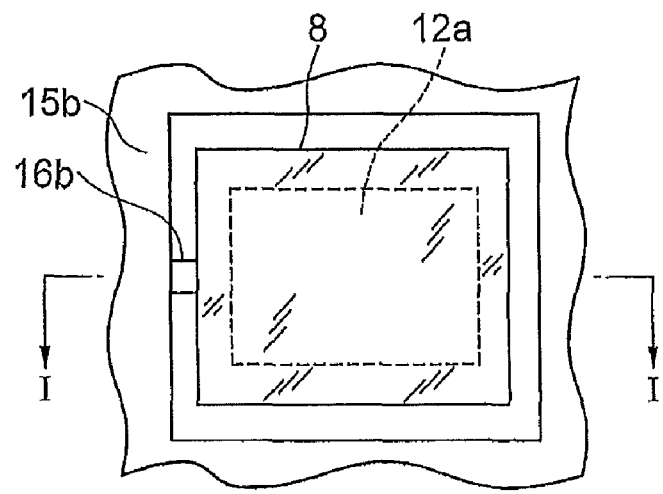
FIG. 2A shows a wafer on which the covers are formed.

Furthermore, as shown in FIG. 1 and FIG. 2A, exciting electrodes 10 are formed on the two main surfaces and two side surfaces of the vibrating arms 3 of the individual framed crystal plates 7 in the crystal wafer 15a (see FIG. 12). Moreover, extraction electrodes 11 extend from the exciting electrodes 10 to the base section 2. On the side surfaces of the base section 2 where the vibrating arms 3 are not formed, connecting sections 6 extend from the two side surfaces on mutually opposite sides, to the frame section 5, and the extraction electrodes 11 extend to the two main surfaces of the frame section 5 via the two main surfaces of the connecting sections 6.

The cover 8 is composed of crystal or glass, and in the crystal wafer 15a, as shown in FIG. 2A, concave sections 12a are formed in regions of the main surface opposing the plurality of resonating sections 4.

The base 9 is also composed of crystal or glass, and in the wafer 15c concave sections 12b are formed in regions of the main surface opposing the resonating sections 4. Furthermore, auxiliary electrodes 13 are formed in parts of the base 9 which oppose the extraction electrodes 11 formed in the crystal plate 7, and the extraction electrodes 11 and the through holes 14 are connected electrically by mutual contact. Moreover, the auxiliary electrodes 13, via a conducting path (not shown) on the inside surface of through holes 14 formed at the approximate center of the auxiliary electrodes 13, are electrically connected to mount terminals (not shown) formed on the opposite surface from the main surface facing the framed crystal plate 7.

Figure 2B:
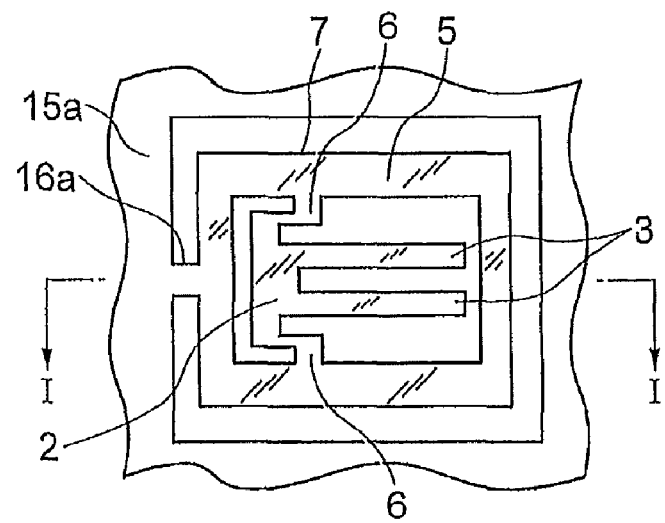
FIG. 2B shows a wafer on which the framed crystal plates are formed.
Figure 2C:
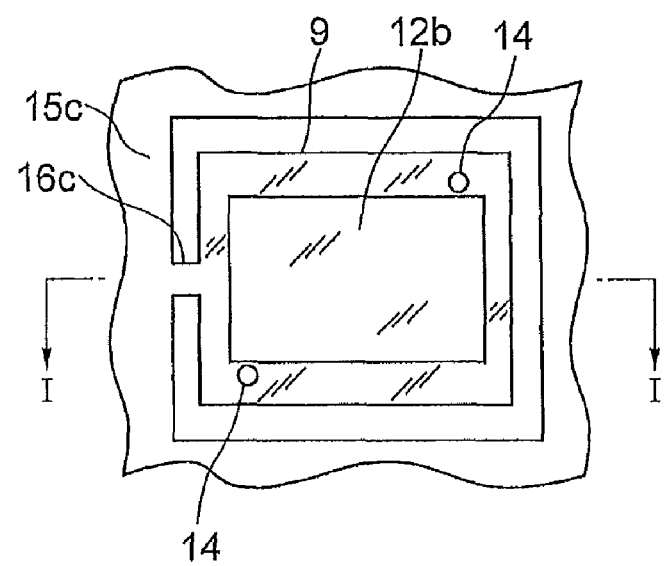
FIG. 2C shows a wafer on which the bases are formed.

In such a stacked crystal resonator, first, a metallic film to serve as a corrosion resistant film is formed on the entirety of the two main surfaces of the crystal wafer 15a serving as the first wafer shown in FIG. 1 and FIG. 2B by means of sputtering or vapor deposition. This metallic film is a laminated film having a chrome (Cr) film as a lower layer and a gold (Au) film as an upper layer. Furthermore, by coating a resist film on the surface of the metallic film and using a photolithographic technique, the resist film forms the planar outer dimension pattern of the framed crystal plate 7 and the support section 16a serving as the first support section, and the crystal surrounding this planar outer dimension pattern is exposed.

Then, etching is performed using an etching solution such as hydrofluoric acid or ammonium fluoride, and subsequently, the corrosion resistant film (metallic film) and resist film are removed, thereby forming in the crystal wafer 15a the individual framed crystal plates 7 connected to the crystal wafer 15a by the support sections 16a.

Furthermore, on the crystal wafer 15b serving as the second wafer shown in FIG. 1 and FIG. 2A, similarly, a metallic film to serve as a corrosion resistant film is formed on the two main surfaces thereof. Then, by coating a resist film on the surface of the metallic film and using a photolithographic technique, the resist film forms the planar outer dimension pattern of the cover 8 and the support section 16b serving as the second support section, and the crystal surrounding this planar outer dimension pattern is exposed. Then, etching is performed to form in the crystal wafer 15b the individual covers 8 connected to the crystal wafer 15b by the support sections 16b.

Then, the resist film and corrosion resistant film (metallic film) are removed from the region to serve as the concave section 12a formed on one main surface of the cover 8. Furthermore, the resist film and corrosion resistant film (metallic film) on the opposite surface of the support section 16a from the surface facing the crystal wafer 15a, that is, the resist film and corrosion resistant film (metallic film) on the support section 16b on the same surface as the other surface of the cover 8, are removed. Then, after performing a half-etching process (etching performed to a given depth instead of completely through the wafer), the resist film and corrosion resistant film (metallic film) are removed. By this process, the concave sections 12a are formed in the individual covers 8 formed on the crystal wafer 15a (also see FIG. 12). Furthermore, the thickness of the support section 16b is thinner than the thickness of the connection section of the cover 8 which connects to the support section 16b.

Moreover, on the crystal wafer 15c serving as the third wafer shown in FIG. 1, in the same manner as the crystal wafer 15b, by etching, the individual bases 9 which are connected to the crystal wafer 15c by the support sections 16c serving as the third support sections are formed. At this time, half-etching is conducted on the support section 16c from the opposite surface of the support section 16c to the surface opposing the crystal wafer 15a, that is, the same surface as the opposite surface to the main surface of the base 9 where the concave section 12b is formed, so that the thickness of the support section 16c is thinner than the thickness of the connection section where the base 9 connects to the support section 16c. At the same time as this half etching process, the concave section 12b is formed in the crystal wafer 15c. Accordingly, the depth g2 from the surface of the crystal wafers 15b and 15c to the support sections 16b and 16c is equivalent to the depth g1 of the concave sections 12a and 12b. The through holes 14 are also formed in the base 9 during the etching process.

Figure 13A:
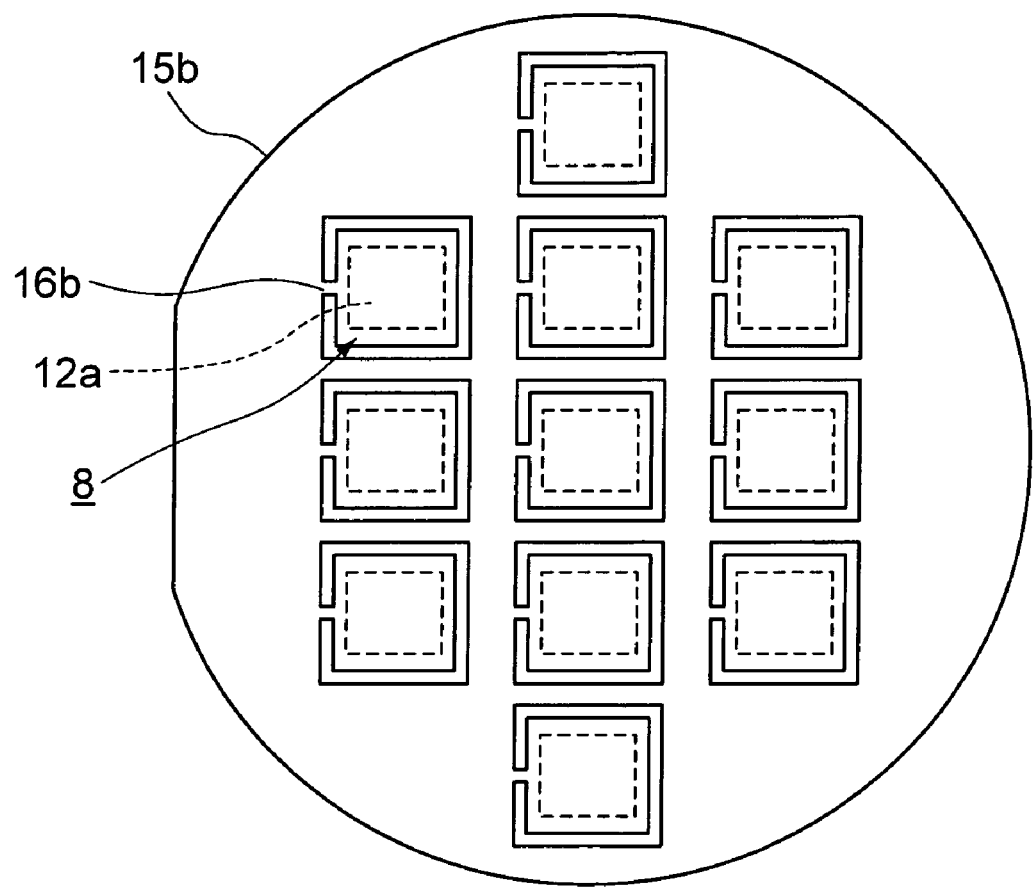
FIG. 13A shows a wafer on which the covers are formed.
Figure 13B:
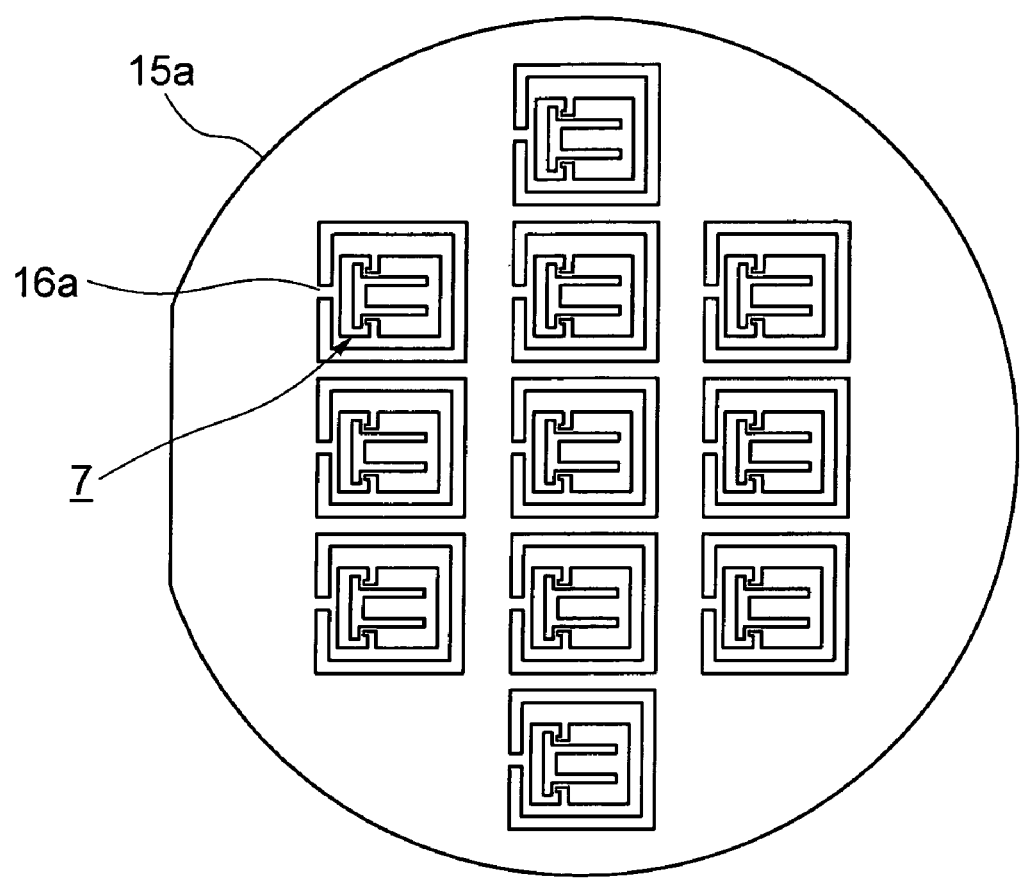
FIG. 13B shows a wafer on which the framed crystal plates are formed.
Figure 13C:
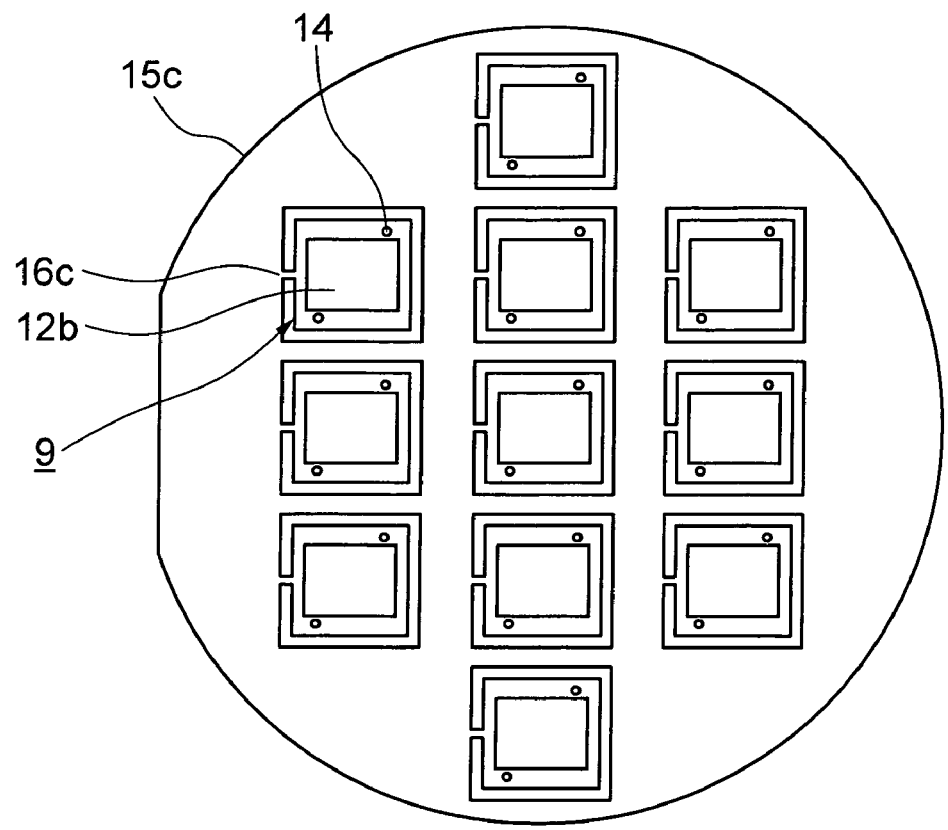
FIG. 13C shows a wafer on which the bases are formed.
Figure 14:
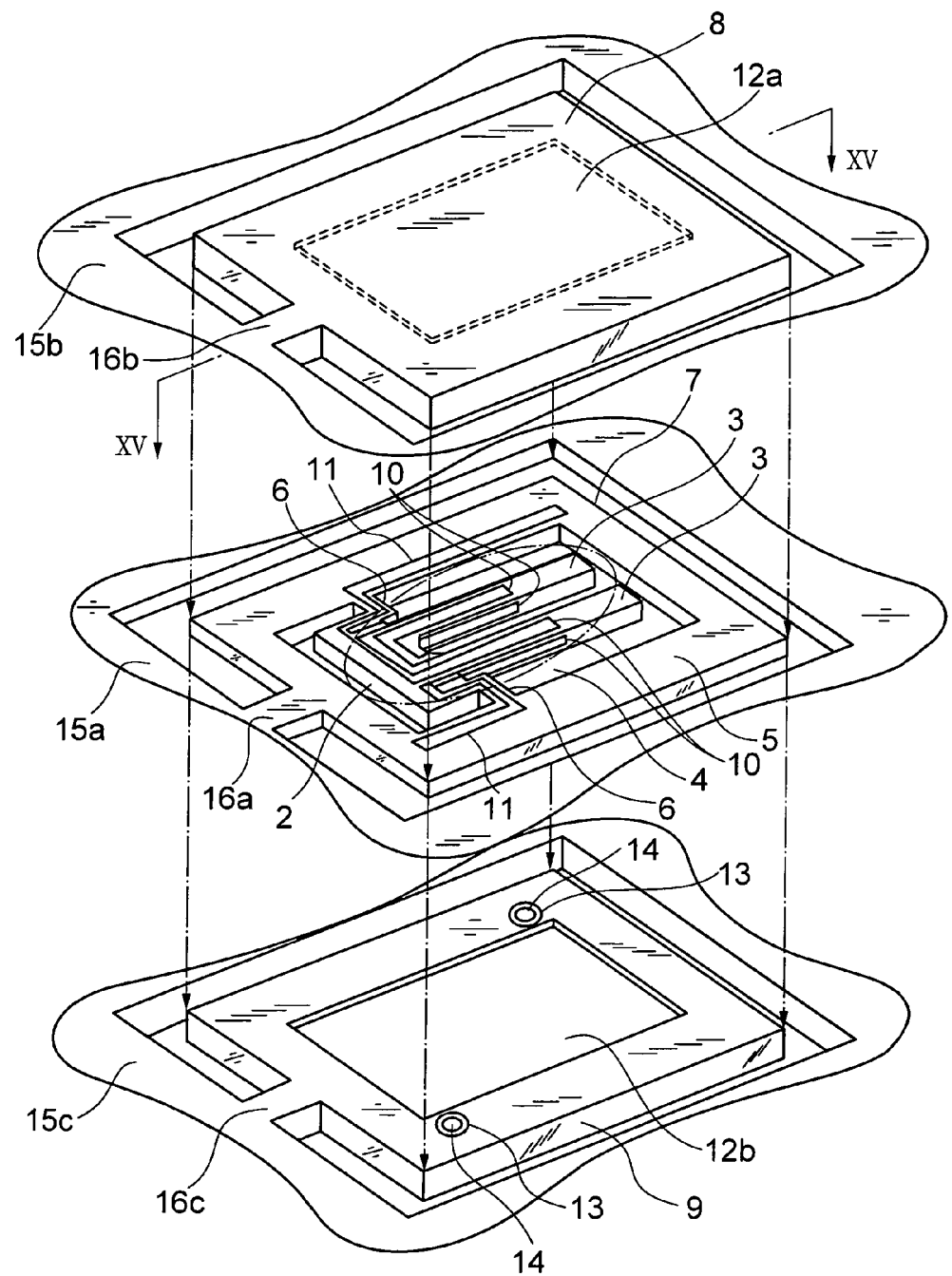
FIG. 14 is an exploded view for describing a conventional example of wafers on which stacked crystal resonators are formed.
Figure 15:
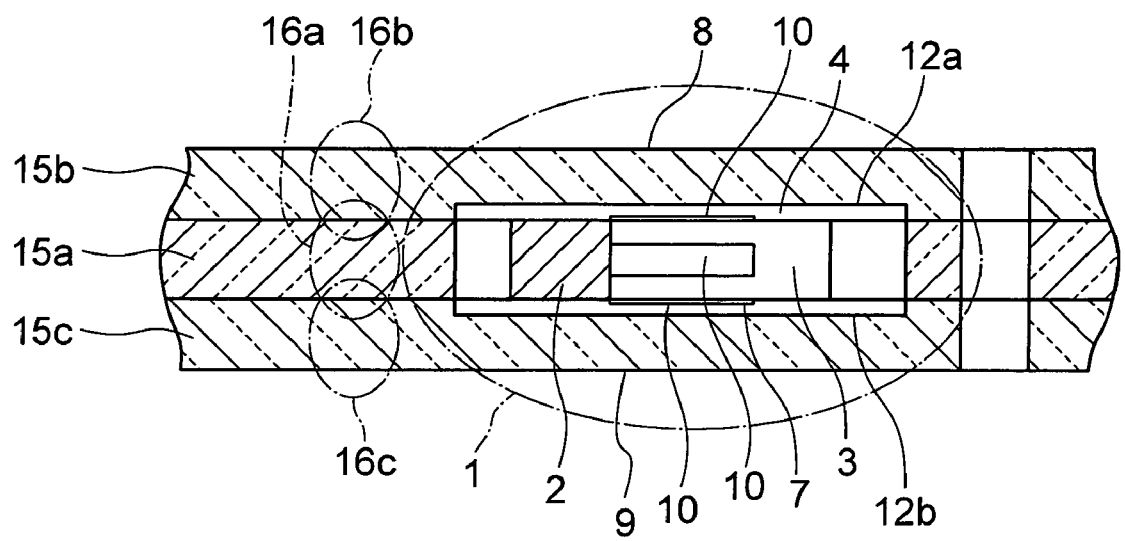
FIG. 15 is a cross-sectional view along the line XV-XV in FIG. 14, in which wafers on which stacked crystal resonators according to a conventional example are formed are superposed.

The planar outer dimensions of the framed crystal plate 7, the cover 8, and the base 9 after conducting etching and half-etching on the crystal wafers 15a, 15b, and 15c differ from the conventional example shown in FIG. 13 in that, as shown in FIG. 1, the support sections 16b and 16c are thinner.

Next, by forming metallic films on the crystal wafer 15a by means of sputtering or vapor deposition, the exciting electrodes 10 and the extraction electrodes 11 are formed in the framed crystal plates 7. By also subjecting the crystal wafer 15c to sputtering or vapor deposition, the auxiliary electrodes 13, the mount terminals, and the conducting paths inside the through holes 14 are formed in the base 9. The exciting electrodes 10, the extraction electrodes 11, the auxiliary electrodes 13, the mount terminals, and the conducting paths are formed as laminated films having, for example, a chrome film as a lower layer and a gold film as an upper layer.

Next, the frame section 5 of the framed crystal plate 7, and the edges of the main surfaces of the cover 8 and base 9 where the concave sections 12a and 12b are formed are cleaned. Then, the crystal wafers 15b and 15c are superposed on the two main surfaces of the crystal wafer 15a. Subsequently, the base 9 and the cover 8 are joined to the two main surfaces of the frame 5 by siloxane bonding (Si—O—Si).

Next, the resonating section 4 is seal-enclosed between the cover 8 and the base 9 by filling the through holes 14 with, for example, a gold-tin (Au—Sn) alloy and then performing heating. By this process, individual stacked crystal resonators 1 are formed which are connected to the crystal wafers 15a, 15b, and 15c by the support sections 16a, 16b, and 16c.

Figure 3:
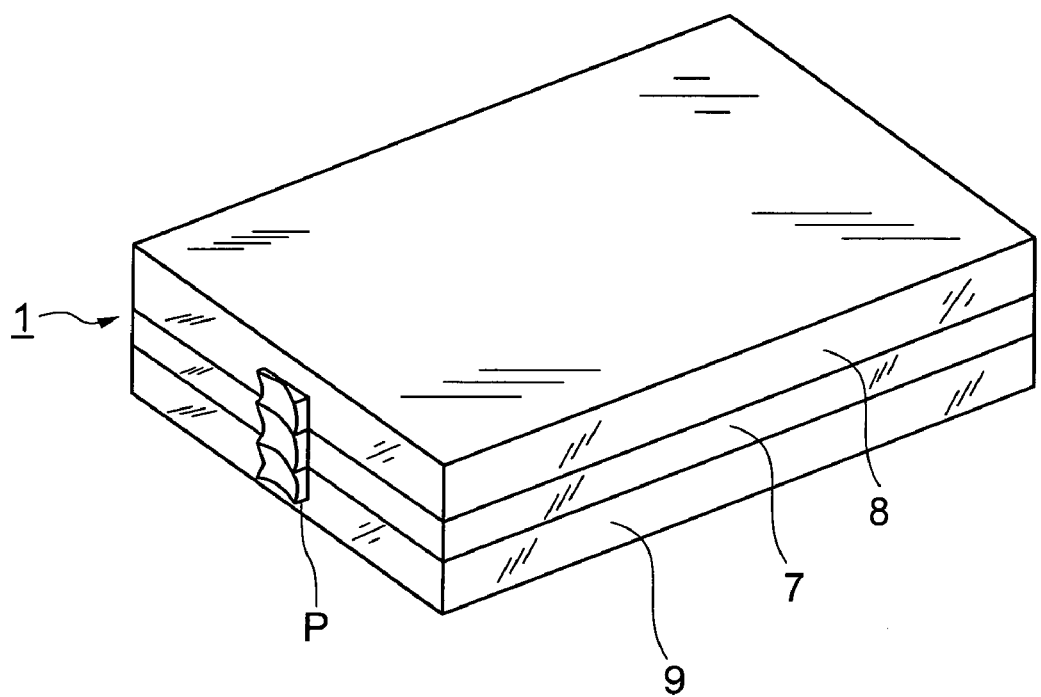
FIG. 3 is a perspective view of the first embodiment of the stacked crystal resonator of the present invention.

Finally, by the application of pressure or adhesion to the base 9 or the cover 8 of the stacked crystal resonator 1, the stacked crystal resonators 1 are broken out of the crystal wafers 15a, 15b, and 15c into individual pieces. In the stacked crystal resonators 1 formed in this manner, as shown in FIG. 3, a residual section P remains at the outer surface of the support sections 16a, 16b, and 16c.

According to such a manufacturing method, when the individual stacked crystal resonators 1 connected to the crystal wafers 15a, 15b, and 15c are formed, a stepped section is formed by the sides of the two main surfaces of the stacked crystal resonator 1 and the support sections 16b and 16c sunken into these two main surfaces (see h in FIG. 1). Therefore, when force is applied to the stacked crystal resonator 1 by pressure or adhesion to break out into individual pieces, the stress is concentrated on the support sections 16a, 16b, and 16c. Accordingly, the individual stacked crystal resonators 1 can be easily broken out from the crystal wafers 15a, 15b, and 15c without causing damage, and further, when breaking out the individual pieces, there is much less chance of damage occurring to the outer surfaces and the like of the stacked crystal resonator 1 where the support sections 16a, 16b, and 16c are formed.

Furthermore, so that the depth g2 from the surface of the crystal wafers 15b and 15c to the support sections 16b and 16c is equal to the depth g1 of the concave sections 12a and 12b shown in FIG. 1, the half-etching of the support sections 16b and 16c is performed at the same time as the half-etching to form the concave sections 12a and 12b. Accordingly, high productivity of the stacked crystal resonators can be maintained without unduly complicating the manufacturing process.

First Modified Example of First Embodiment

Figure 4A:
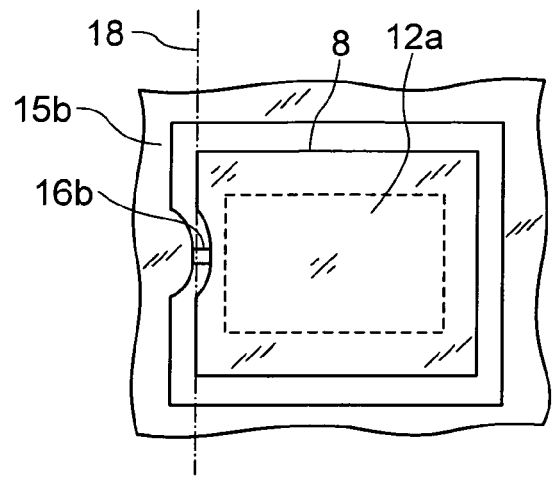
FIG. 4A shows a wafer on which the covers are formed.
Figure 4B:
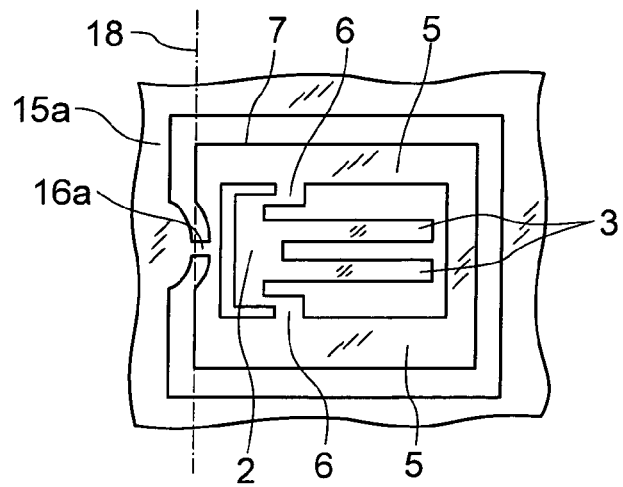
FIG. 4B shows a wafer on which the framed crystal plates are formed.
Figure 4C:
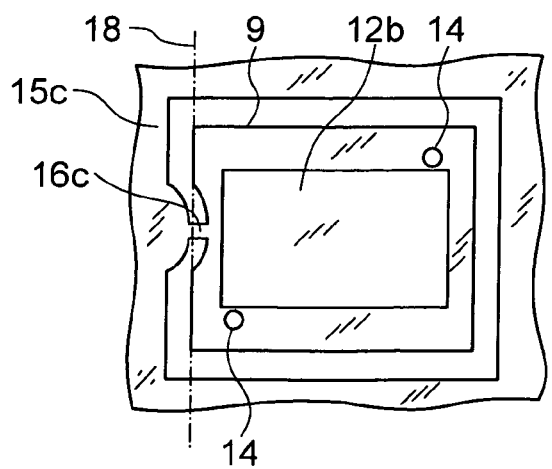
FIG. 4C shows a wafer on which the bases are formed.

FIG. 4 includes plan views of wafers for describing a first modified example of the first embodiment, wherein FIG. 4A shows a wafer on which the covers are formed, FIG. 4B shows a wafer on which the framed crystal plates are formed, and FIG. 4C shows a wafer on which the bases are formed.

The point where this modified example differs from the first embodiment is the location where the support sections 16a, 16b, and 16c are formed. In the present modified example, the support sections 16a, 16b, and 16c are formed inward of an outermost contour line 18 of the cover 8, the framed crystal plate 7, and the base 9. Thus, the residual sections P (See FIG. 3) of the support sections 16a, 16b, and 16c formed on the outside surface of the stacked crystal resonator 1 during the breaking thereof do not protrude beyond the outer surface. Accordingly, when mounting the stacked crystal resonator 1 onto a set substrate (not shown), a problem whereby the presence of the residual section P prevents mounting to the small mounting area can be avoided.

Second Modified Example of First Embodiment

Figure 5:
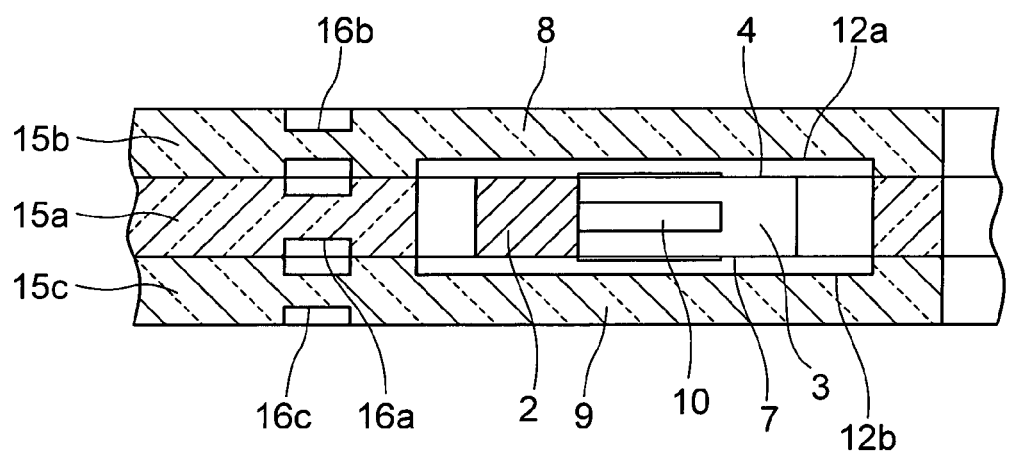
FIG. 5 is a cross-sectional view for describing a second modified example of the first embodiment when the wafers are superposed.

FIG. 5 is a cross-sectional view describing a second modified example of the first embodiment of the present invention, when the wafers are superposed. The point where this modified example differs from the first embodiment is the thickness of the support sections 16a, 16b, and 16c. In the first embodiment, as shown in FIG. 1, only one of the main surfaces of the support sections 16b and 16c is thinned by half-etching when forming the support sections. However, in the second modified example, half-etching is conducted on the two main surfaces of the support sections 16a, 16b, and 16c. Therefore, stacked crystal resonators 1 can be broken out from the wafers 15a to 15c into individual pieces using less force than the first embodiment.

Second Embodiment

Figure 6A:
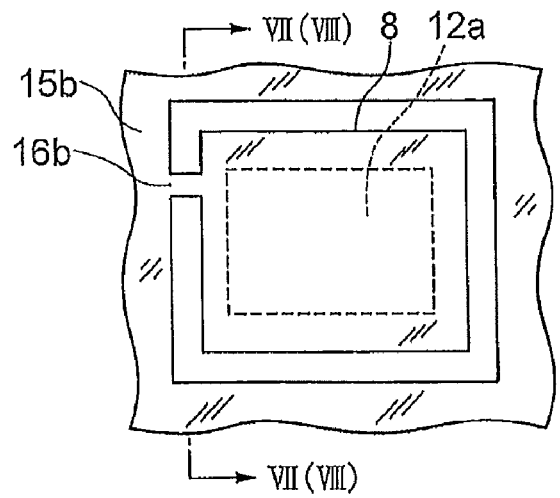
FIG. 6A shows a wafer on which the covers are formed.
Figure 6B:
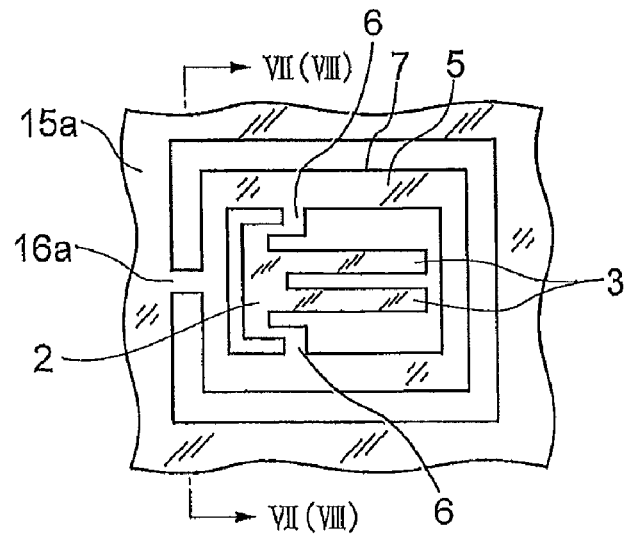
FIG. 6B shows a wafer on which the framed crystal plates are formed.
Figure 6C:
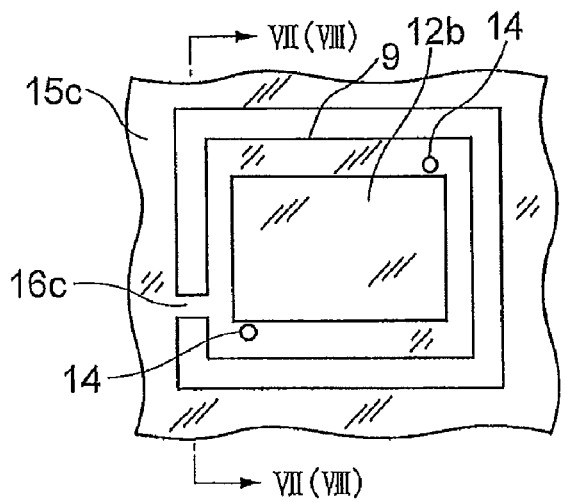
FIG. 6C shows a wafer on which the bases are formed.
Figure 7:
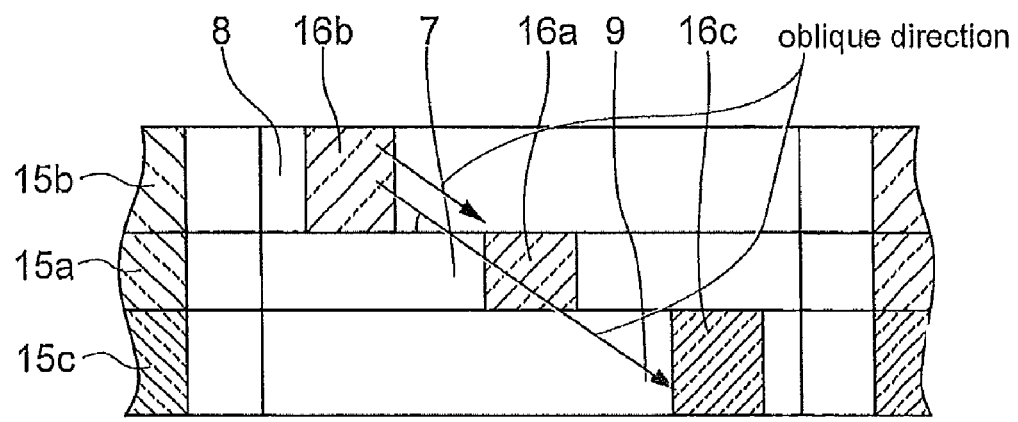
FIG. 7 is a cross-sectional view along the line VII-VII in FIG. 6, describing a second embodiment of the present invention when the wafers are superposed.

FIG. 6 and FIG. 7 are views of wafers for describing a second embodiment of the present invention, wherein FIG. 6A is a partial plan view of a wafer on which the covers 8 are formed, FIG. 6B is a partial plan view of a wafer on which the framed crystal plates 7 are formed, FIG. 6C is a partial plan view of a wafer on which the bases 9 are formed, and FIG. 7 is a cross-sectional view along the line VII-VII in FIG. 6 when the wafers are superposed.

The point where the second embodiment differs from the first embodiment is the location where the support sections 16a, 16b, and 16c are formed. In the second embodiment, the support sections 16a, 16b, and 16c, when the crystal wafers 15a, 15b, and 15c are superposed, are formed so as to be located upon a diagonal line 19 on the same outer surface of the stacked crystal resonator 1. At this time, the support sections 16 a, 16b, and 16c are formed such that the support section 16b and the support section 16c are located in an oblique direction relative to the support section 16a in the thickness direction of the crystal wafer 15a.

According to such a manufacturing method, as shown in FIG. 7 none of the support sections 16a, 16b, and 16c overlap. Thus, when breaking out the stacked crystal resonators 1 from the crystal wafers 15a, 15b, and 15c into individual pieces, the support sections 16a, 16b, and 16c bend easily. Accordingly, in comparison with a case where all of the support sections 16a, 16b, and 16c overlap, the stacked crystal resonators 1 can be broken out from the wafers into individual pieces using a smaller amount of force, and at this time there is much less chance of damage occurring to the outer surfaces and the like of the stacked crystal resonator 1 where the support sections 16a, 16b, and 16c are formed.

Modified Example of Second Embodiment

Figure 8:
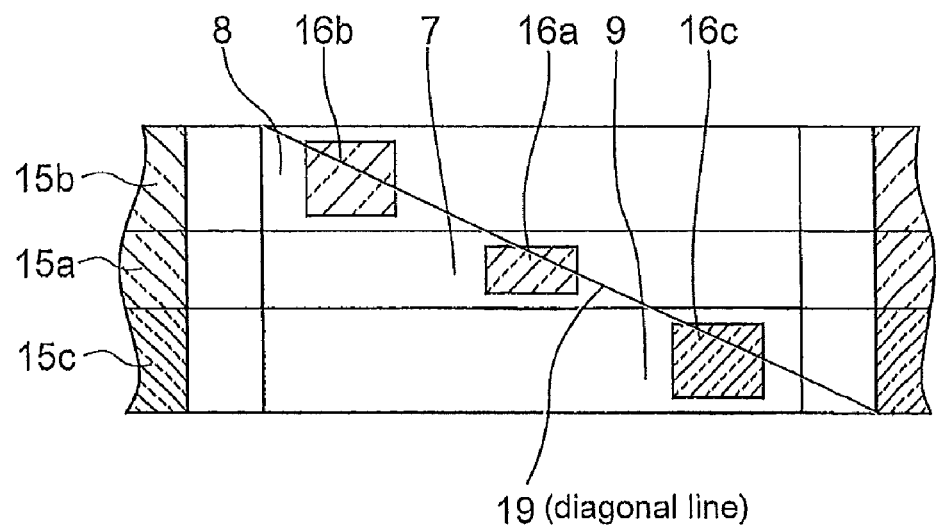
FIG. 8 is a cross-sectional view along the line VIII-VIII in FIG. 6, describing a modified example of the second embodiment of the present invention when the wafers are superposed.

FIG. 8 is a cross-sectional view along the line VIII-VIII in FIG. 6, describing a modified example of the second embodiment of the present invention when the wafers are superposed. The point where this modified example differs from the second embodiment is that, as shown in FIG. 8, half-etching is conducted on the support sections 16a, 16b, and 16c to reduce the thickness thereof. Therefore, the stacked crystal resonators 1 can be broken away into individual pieces using an even smaller amount of force than in the second embodiment.

Third Embodiment

Figure 9A:
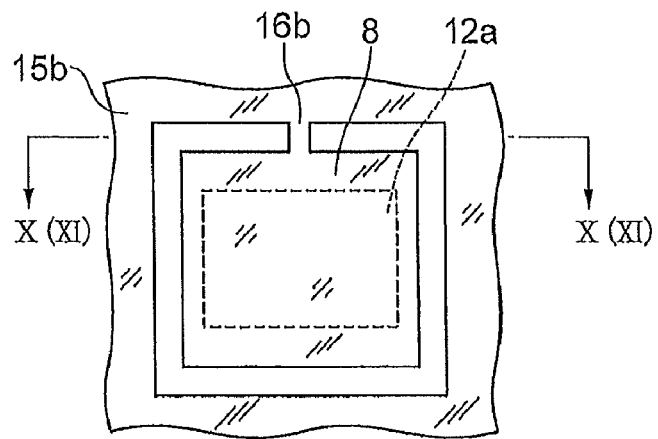
FIG. 9 is a partial plan view of wafers, describing a third embodiment of the present invention.
Figure 9B:
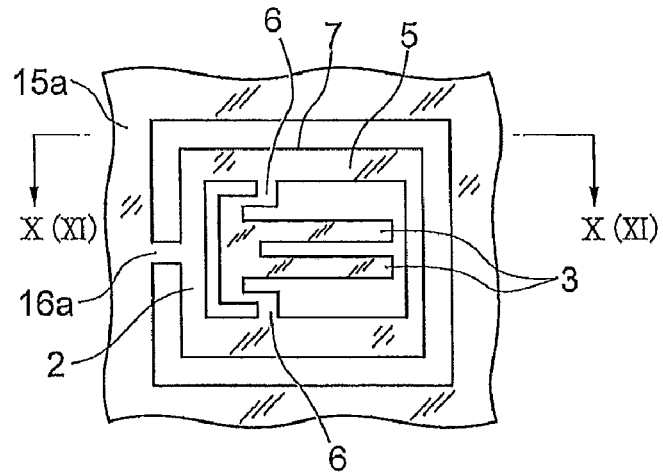
Figure 9C:
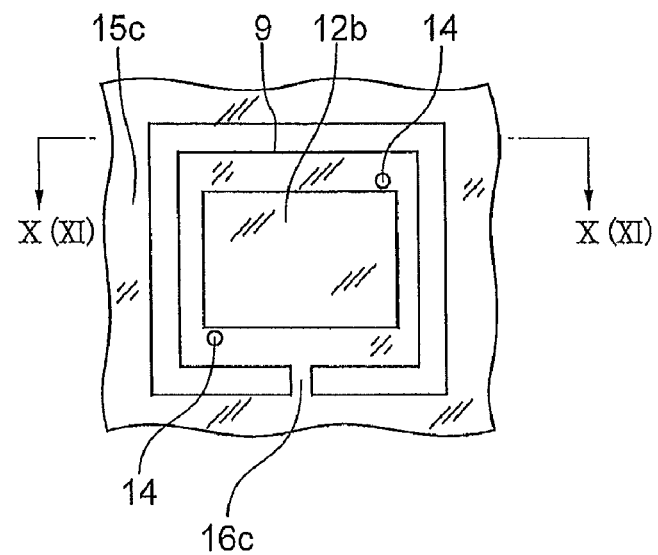
Figure 10:
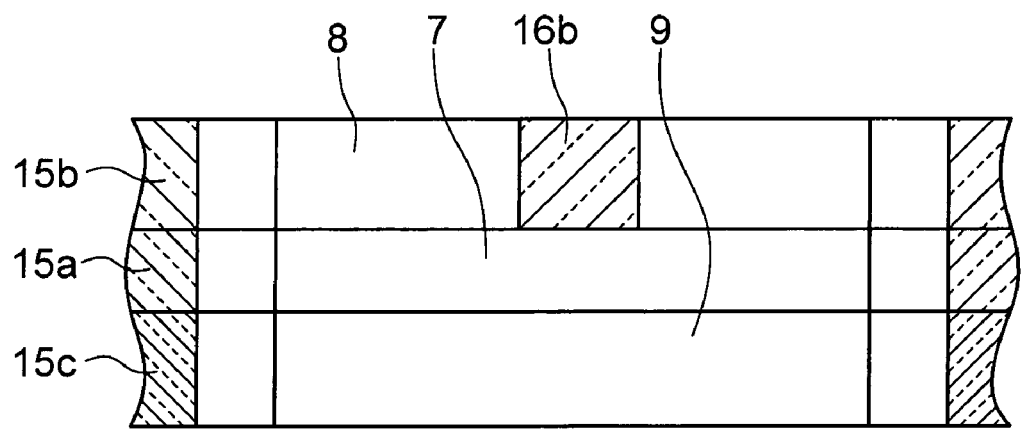
FIG. 10 is a cross-sectional view along the line X-X in FIG. 9, describing the third embodiment when the wafers are superposed.

FIG. 9 and FIG. 10 are views of wafers for describing a third embodiment of the present invention, wherein FIG. 9A is a partial plan view of a wafer on which the covers 8 are formed, FIG. 6B is a partial plan view of a wafer on which the framed crystal plates 7 are formed, FIG. 6C is a partial plan view of a wafer on which the bases 9 are formed, and FIG. 10 is a cross-sectional view along the line X-X in FIG. 9 when the wafers are superposed.

The point where the third embodiment differs from the first embodiment is the location where the support sections 16a, 16b, and 16c are formed. In the third embodiment, the support sections 16a, 16b, and 16c are formed such that, when the wafers 15a, 15b, and 15c are superposed, the support sections 16a, 16b, and 16c are disposed on different outside surfaces of the stacked crystal resonator 1. At this time, the support sections 16a, 16b, and 16c are formed such that the support section 16b and the support section 16c are located in an oblique direction relative to the support section 16a in the thickness direction of the crystal wafer 15a.

According to such a manufacturing method, the support sections 16a, 16b, and 16c are not adjacent when the crystal wafers 15a, 15b, and 15c are superposed. Therefore, when breaking out the stacked crystal resonator 1 into individual pieces, the stress is concentrated on one or other of the support sections 16a, 16b, and 16c. For example, the stress is first concentrated on the support section 16b causing cracks therein, the stress is next concentrated on the support section 16a causing cracks therein, and the stress is finally concentrated on the support section 16c causing cracks therein, after which the support sections 16a, 16b, and 16c successively break. Accordingly, compared to a case where the support sections 16a, 16b, and 16c are superposed in their entirety, individual stacked crystal resonators can be easily broken out using a small amount of force.

Modified Example of Third Embodiment

Figure 11:
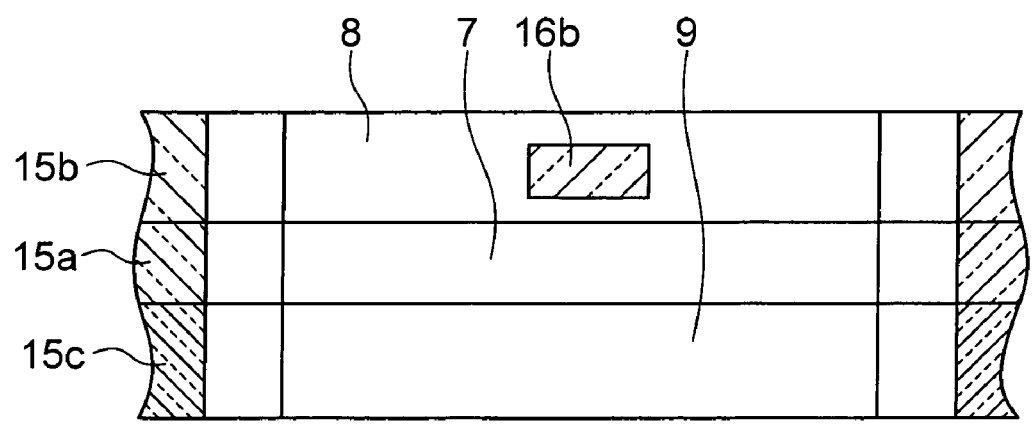
FIG. 11 is a cross-sectional view along the line XI-XI in FIG. 9, describing a modified example of the third embodiment when the wafers are superposed.

FIG. 11 is a cross-sectional view along the line XI-XI in FIG. 9, describing a modified example of the third embodiment when the wafers are superposed. The point where this modified example differs from the third embodiment is that half-etching is conducted on the support sections 16a, 16b, and 16c to reduce the thickness thereof. Therefore, the stacked crystal resonators 1 can be broken away into individual pieces using an even smaller amount of force than in the third embodiment.

The half-etching of the support sections 16b and 16c in the embodiments described above is performed at the same time as the half-etching of the concave section 12a of the cover 8 and the concave section 12b of the base 9. Accordingly, the depth from the surface of the crystal wafers 15b and 15c to the support sections 16b and 16c (g2 in FIG. 1) is equivalent to the depth of the concave sections 12a and 12b (g1 in FIG. 1). However, after this half-etching, by subjecting only the support sections 16b and 16c to further half-etching, or subjecting only the concave sections 12a and 12b to further half-etching, the depth from the surface of the crystal wafers 15b and 15c to the support sections 16b and 16c may be made different from the depth of the concave sections 12a and 12b.

In the embodiments described above, the cover 8 and the base 9 are formed from crystal, but may be formed from glass or silicon or the like. In this case, a suitable method of joining the framed crystal plate 7 to the cover 8 and the base 9 can be selected from such methods as siloxane bonding, anodic bonding, resin bonding, or metal bonding.

From the perspectives of reducing size and height, it is advantageous that the cover 8 and the base 9 be formed from crystal rather than glass. The reason is as follows. In other words, as the glass, borosilicate glass which generally costs less than crystal is often used. Here, the Knoop hardness of borosilicate glass is 590 kg/mm². On the other hand, the Knoop hardness of crystal, at 710 to 790 kg/mm², is greater than that of borosilicate glass. Accordingly, when crystal is used as the cover 8 and the base 9, in comparison with a case where borosilicate glass is used, it is possible to reduce the size and height of the stacked crystal resonator while maintaining equal or greater strength.

Furthermore, in the embodiments described above, a resonating section with a tuning fork shape was used, but a rectangular AT-cut (thickness-shear vibrating) resonating section, for example, may be used. Moreover, when breaking out a stacked crystal resonator 1 connected to the crystal wafers 15a, 15b, and 15c, the stacked crystal resonator 1 may be broken out into individual pieces by placing a suction nozzle in contact with the cover 8 (or base 9) and performing suction, and then moving the suction nozzle upward from the cover 8 (or downward from the base 9).

What is claimed is:

1. A method of manufacturing a stacked crystal resonator, comprising the steps of:
   etching a first wafer made of crystal to form, a framed crystal plate in which a resonating section is surrounded by a frame section and said resonating section is connected to said frame section by a connecting section, and a first support section which connects said framed crystal plate to said first wafer, wherein said first support section is defined by at least one cutout portion provided in the first wafer;
   etching a second wafer to form, a cover to be bonded in a later step to a main surface of said frame section, and a second support section which connects said cover to said second wafer, wherein said second support section is defined by at least one cutout portion provided in the second wafer;
   etching a third wafer to form, a base to be bonded in a later step to another main surface of said frame section, and a third support section which connects said base to said third wafer, wherein said third support section is defined by at least one cutout portion provided in the third wafer;
   superposing said second wafer and third wafer onto the two main surfaces of said first wafer and bonding said cover and base to the two main surfaces of said frame section in said framed crystal plate so as to seal-enclose said resonating section, thereby forming a stacked crystal resonator connected to said first wafer, said second wafer and said third wafer by said first support section, said second support section and said third support section; and
   breaking out the stacked crystal resonators connected to said first wafer, said second wafer and said third wafer into individual pieces;
   wherein a thickness of at least one of said first support section, said second support section and said third support section is thinner than a thickness of a connection section connecting said framed crystal plate, said cover, or said base to said first support section, said second support section or said third support section.

2. A method of manufacturing a stacked crystal resonator according to claim 1, wherein,
   in said step of etching said second wafer, etching is conducted on the opposite surface of said second support section to the surface facing said first wafer, so that a thickness of said second support section is thinner than the thickness of the connection section connecting said cover to said second support section, and
   in said step of etching said third wafer, etching is conducted on the opposite surface of said third support section to the surface facing said first wafer, so that a thickness of said third support section is thinner than the thickness of the connection section connecting said base to said third support section.

3. A method of manufacturing a stacked crystal resonator according to claim 1, wherein each said first, second and third support section is defined by a first and a second opposing cutout portion.

4. A method of manufacturing a stacked crystal resonator, comprising the steps of:
   etching a first wafer made of crystal to form, a framed crystal plate in which a resonating section is surrounded by a frame section and said resonating section is connected to said frame section by a connecting section, and a first support section which connects said framed crystal plate to said first wafer;
   etching a second wafer to form, a cover to be bonded in a later step to a main surface of said frame section, and a second support section which connects said cover to said second wafer;
   etching a third wafer to form, a base to be bonded in a later step to another main surface of said frame section, and a third support section which connects said base to said third wafer;
   superposing said second wafer and third wafer onto the two main surfaces of said first wafer and bonding said cover and base to the two main surfaces of said frame section in said framed crystal plate so as to seal-enclose said resonating section, thereby forming a stacked crystal resonator connected to said first wafer, second wafer and third wafer by said first support section, second support section and third support section; and
   breaking out the stacked crystal resonators connected to said first wafer, said second wafer and said third wafer into individual pieces;
   wherein when said first wafer, said second wafer and said third wafer are superposed, said first, second and third support sections are disposed along an oblique direction relative to a vertical axis of said first wafer defining a thickness of said first wafer where said first support section is defined as a start of said oblique direction.

5. A method of manufacturing a stacked crystal resonator according to claim 4, wherein when said first wafer, said second wafer and said third wafer are superposed, such that said first support section, said second support section and said third support section are formed so as to be disposed upon a diagonal line angled relative to a planer axis of the superimposed frame, cover and base and said first, second and third support sections do not overlap one another.

6. A method of manufacturing a stacked crystal resonator according to claim 4, wherein when said first wafer, said second wafer and said third wafer are superposed, said first support section, said second support section and said third support section are formed so as to be disposed at a different side of said first wafer, said second wafer and said third wafer.

7. A method of manufacturing a stacked crystal resonator according to claim 4,
   wherein a thickness of at least one of said first support section, said second support section and said third support section is thinner than a thickness of a connection section connecting said framed crystal plate, said cover, or said base to said first support section, said second support section or said third support section.

8. A method of manufacturing a stacked crystal resonator according to claim 5, wherein a thickness of at least one of said first support section, said second support section and said third support section is thinner than a thickness of a connection section connecting said framed crystal plate, said cover, or said base to said first support section, said second support section or said third support section.

9. A method of manufacturing a stacked crystal resonator according to claim 6, wherein a thickness of at least one of said first support section, said second support section and said third support section is thinner than a thickness of a connection section connecting said framed crystal plate, said cover, or said base to said first support section, said second support section or said third support section.

* * * * *